United States Patent [19]

Rubinstein

[11] Patent Number: 5,077,686
[45] Date of Patent: Dec. 31, 1991

[54] CLOCK GENERATOR FOR A COMPUTER SYSTEM

[75] Inventor: Jon Rubinstein, Palo Alto, Calif.

[73] Assignee: Stardent Computer, Newton, Mass.

[21] Appl. No.: 472,749

[22] Filed: Jan. 31, 1990

[51] Int. Cl.⁵ .......................... G06F 1/04; G06F 1/12
[52] U.S. Cl. ................... 395/550; 364/934.2; 364/934.71; 364/270.4; 364/DIG. 1; 364/DIG. 2; 377/47
[58] Field of Search ............... 364/200, 900; 377/48, 377/47, 43; 328/60, 61, 62, 63

[56] References Cited

U.S. PATENT DOCUMENTS

| | | | |
|---|---|---|---|
| 3,980,993 | 9/1976 | Bredart et al. | 364/200 |
| 4,095,267 | 6/1978 | Morimoto | 364/200 |
| 4,101,838 | 7/1978 | Aihara et al. | 328/63 |
| 4,231,104 | 10/1980 | St. Clair | 364/900 |
| 4,249,070 | 2/1981 | Miller | 235/92 |
| 4,331,924 | 5/1982 | Elliott et al. | 377/47 X |
| 4,383,303 | 5/1983 | Hoffman | 364/565 |
| 4,386,401 | 5/1983 | O'Brien | 364/200 |
| 4,413,350 | 11/1983 | Bond et al. | 377/47 |
| 4,423,383 | 12/1983 | Svendsen | 328/63 |
| 4,523,274 | 6/1985 | Fukunaga et al. | 364/200 |
| 4,556,984 | 12/1985 | Genrich | 377/47 |
| 4,695,804 | 9/1987 | Bardl et al. | 328/62 X |
| 4,773,031 | 9/1988 | Tobin | 377/47 X |
| 4,893,271 | 1/1990 | Davis et al. | 364/900 |
| 4,943,787 | 7/1990 | Swapp | 331/2 |

Primary Examiner—Michael R. Fleming
Assistant Examiner—Glenn A. Auve
Attorney, Agent, or Firm—Blakely, Sokoloff, Taylor & Zafman

[57] ABSTRACT

A clock frequency multiplication circuit. A circuit is described for receiving a clock signal of a first frequency X and multiplying the frequency of the signal by a multiple N to produce a signal of frequency N times X. The circuit is particularly useful in, for example, computer systems in which it is desired to upgrade certain components such as a processor to operate at an increased clock speed without modifying the clock speed of the system clock and where it is further desired to provide synchronization between the system clock and the processor clock.

13 Claims, 5 Drawing Sheets

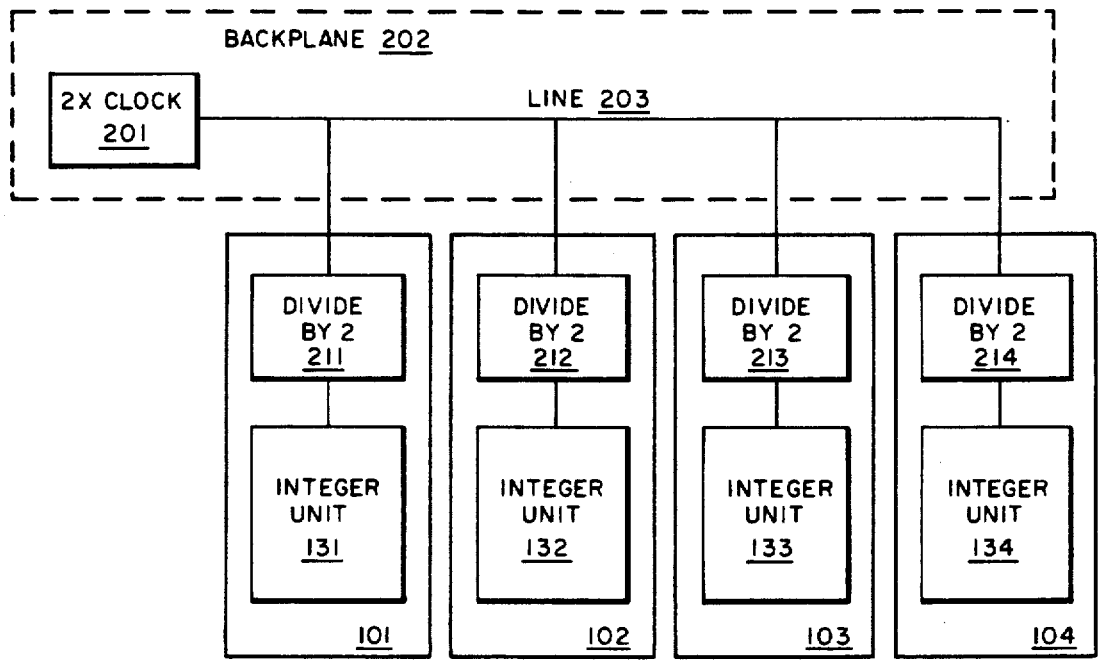
FIG_2
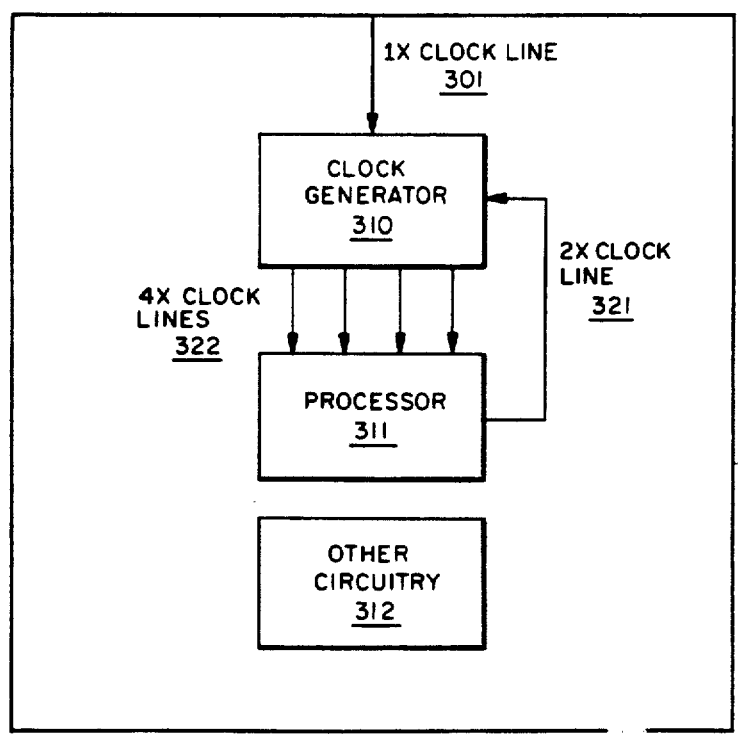
FIG_3

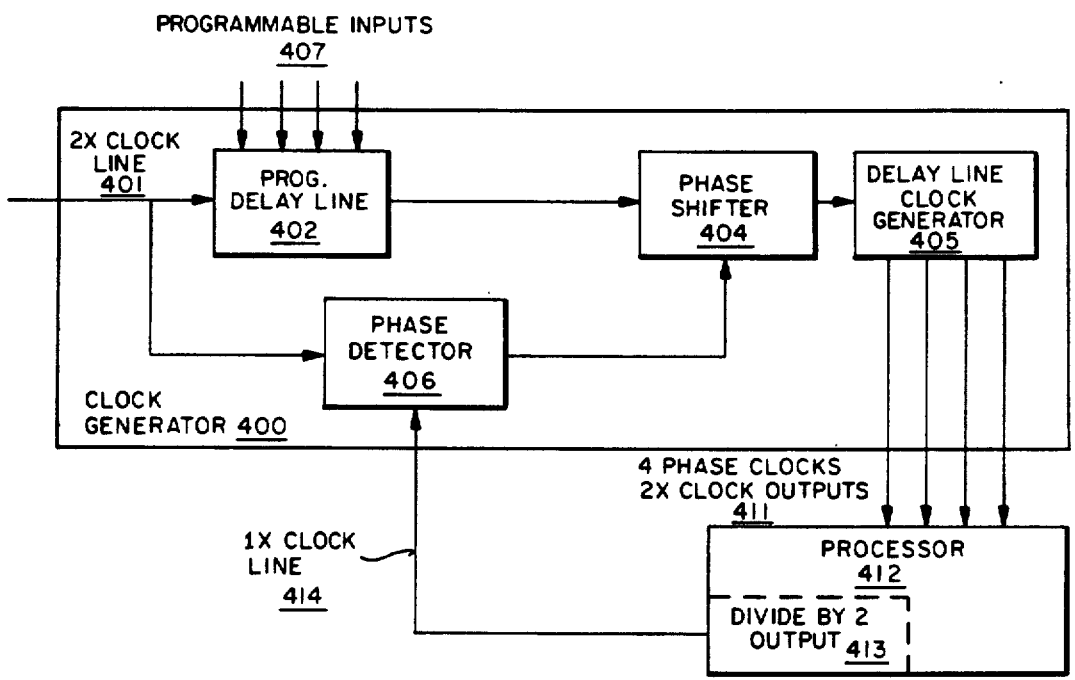
FIG_4 (PRIOR ART)
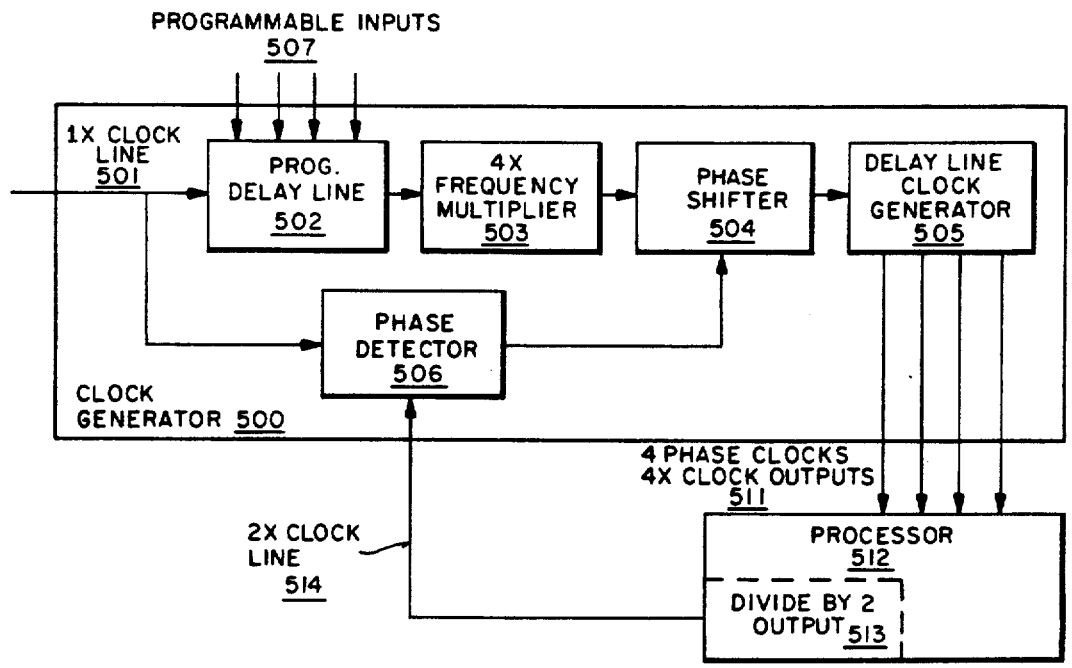
FIG_5

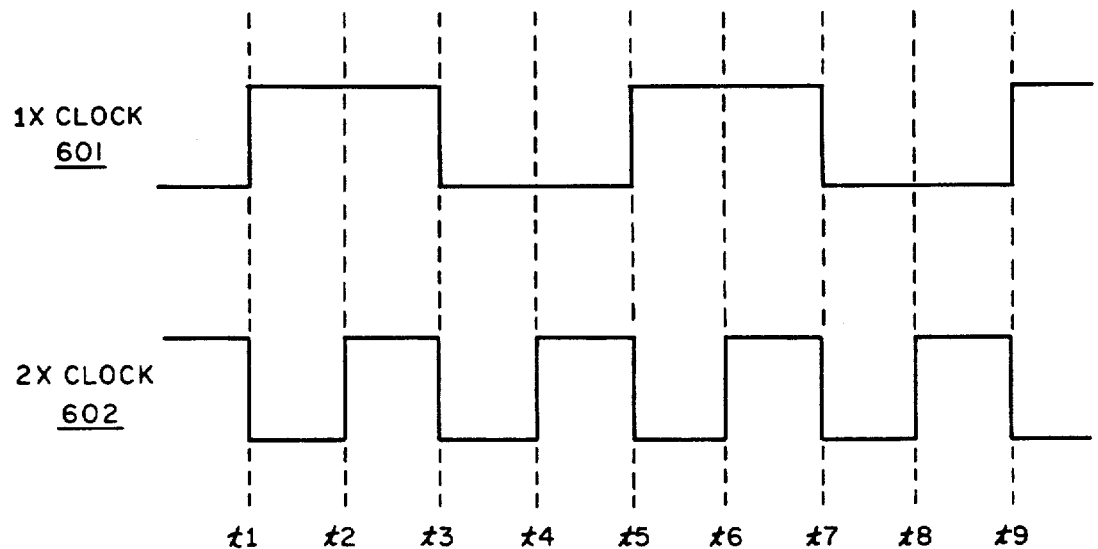
FIG_6
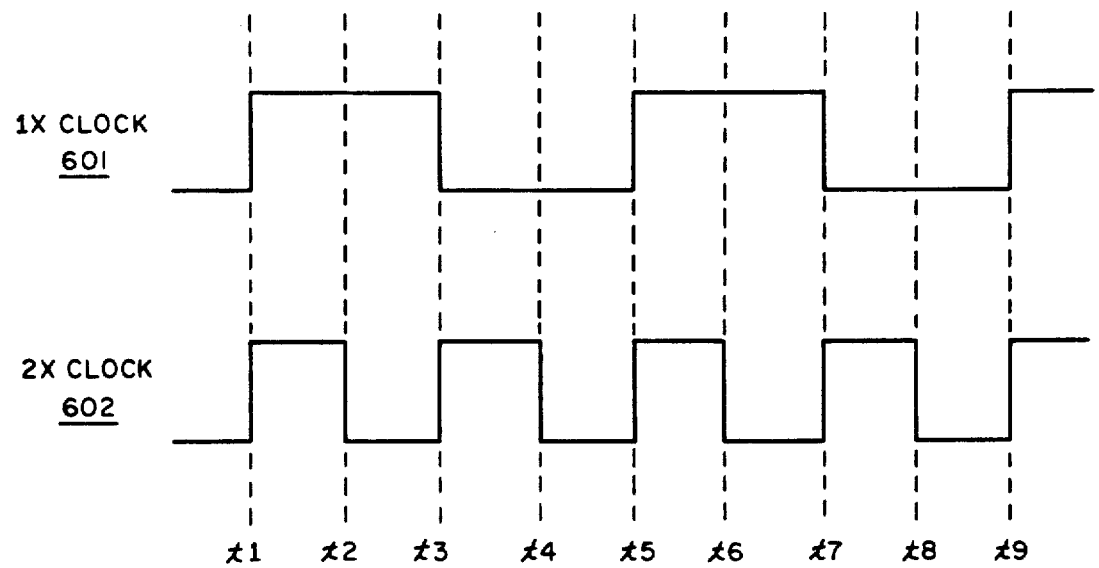
FIG_7

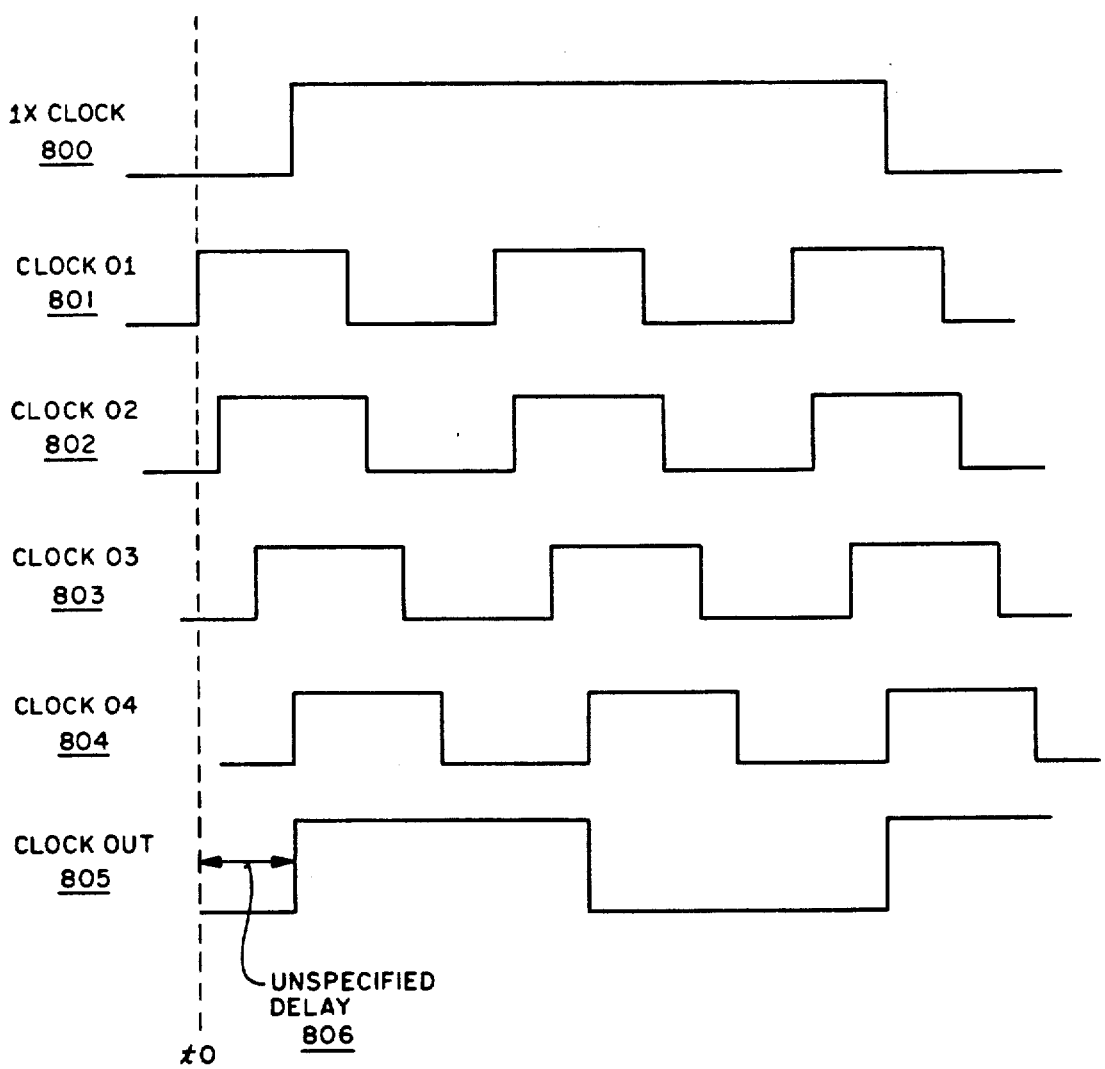

CLOCK GENERATOR FOR A COMPUTER SYSTEM

BACKGROUND OF THE INVENTION

1. Field of the Invention

The present invention relates to the field of clocking apparatus for computer systems; more specifically, the present invention relates to circuitry for generation of clock signals in a multi-processor computer system.

2. Description of the Related Art

Modern day computer systems operate under the control of one or more "clocks" or signal lines carrying a signal of a predetermined frequency and duty cycle. The clock signal is provided to various components in the computer system and these components typically carry out some operation or set of operations during one or more "clock cycles" or cycles of the signal. A crystal or other device is used to generate the clock signal, such crystals being capable of generating clock signals at predetermined frequencies such as 8 Mhz, 16 Mhz, 32 Mhz and 64 Mhz.

Of course, the various components of the computer system must be designed to match the clock speed or frequency. More properly put, the computer system must be designed to provide a clock signal of the appropriate clock speed to circuits used in the computer system. The circuits are typically purchased or otherwise acquired by the computer system designer having a specified clock speed. It follows that should one of the components be changed or upgraded with a component having a different required clock input frequency that the computer system must be redesigned to provide for an additional clock input.

This creates a special problem in multiple processor computer systems where it is desired to operate all components under the control of a single clock and, for example, only one of the processor modules is upgraded with a higher speed processor. Alternatively, all processors may be upgraded but other components in the system may still require a lower speed clock. One solution to this problem may be to provide a higher speed systems clock (e.g., upgrade the system clock from being a 32 Mhz clock to being a 64 Mhz clock) in order to the satisfy the needs of the processors and then to provide clock division circuitry to divide the clock speed to the frequency required by the other components.

However, in the computer system of the present invention the system clock is provided on a backplane with which numerous circuit boards, such as processor boards, are coupled. Replacement of the backplane, or the clock circuitry on the backplane, to provide a higher speed clock is expensive and, further, would require field service of each installed system to accomplish the desired replacement.

Therefore, what is desired is to develop clock generation circuitry which provides increased clock speed without the requirement of replacing the system clock.

It should be noted that the preferred embodiment of the present invention is designed for implementation on a computer system available from Stardent Computer, Inc. of Newton, Mass. FIG. 4, which will be explained in greater detail below, illustrates certain clock generation circuitry of a prior art computer system available from Stardent Computer, Inc. under the tradename TITAN. The prior art TITAN computer utilizes a microprocessor manufactured by MIPS Computer Systems, Inc. of Sunnyvale, Calif. under the tradename R2000. The R2000 microprocessor requires a 32 Mhz clock signal. In the preferred embodiment of the present invention, processor boards may utilize a microprocessor available from MIPS Computer Systems Inc. under the tradename R3000. The R3000 microprocessor requires a 64 Mhz clock signal.

SUMMARY OF THE INVENTION

The present invention relates to a clock generation circuit for a computer system. Specifically, the clock generation circuit accepts as an input a clock signal of a first frequency X (the system clock) and provides as an output a clock signal of a second frequency N time X. This circuit has particular application in, for example, a computer system having a system clock speed of X and in which the system clock is distributed to a plurality of components. In such a computer system it may be desirable to replace one of such plurality of components with a components operating at a higher clock speed. For example, a processor operating at 32 Mhz may be replaced by a processor operating at 64 Mhz.

In such a case it is desirable to provide the new processor operating at 64 Mhz with a 64 Mhz clock signal synchronized with the system clock. The circuit of the present invention provides such a clock signal.

BRIEF DESCRIPTION OF THE DRAWINGS

FIG. 2 is a block diagram illustrating the computer system of the present invention with particular illustration of clock signal lines utilized by the present invention.

FIG. 3 is a block diagram illustrating a processor module as may be utilized by the present invention.

FIG. 4 is a block diagram illustrating a prior art clock signal generation circuit.

FIG. 5 is a block diagram illustrating a clock signal generation circuit of the present invention.

FIG. 6 is a timing diagram illustrating a timing sequence for clock signals as may be seen in the present invention at system power-up time.

FIG. 7 is a timing diagram illustrating a timing sequence for clock signals as may be seen in the present invention after phase locking has occurred.

FIG. 8 is a timing diagram illustrating four phase clock inputs as may be utilized by the present invention.

DETAILED DESCRIPTION OF THE PREFERRED EMBODIMENT

Figure 1:
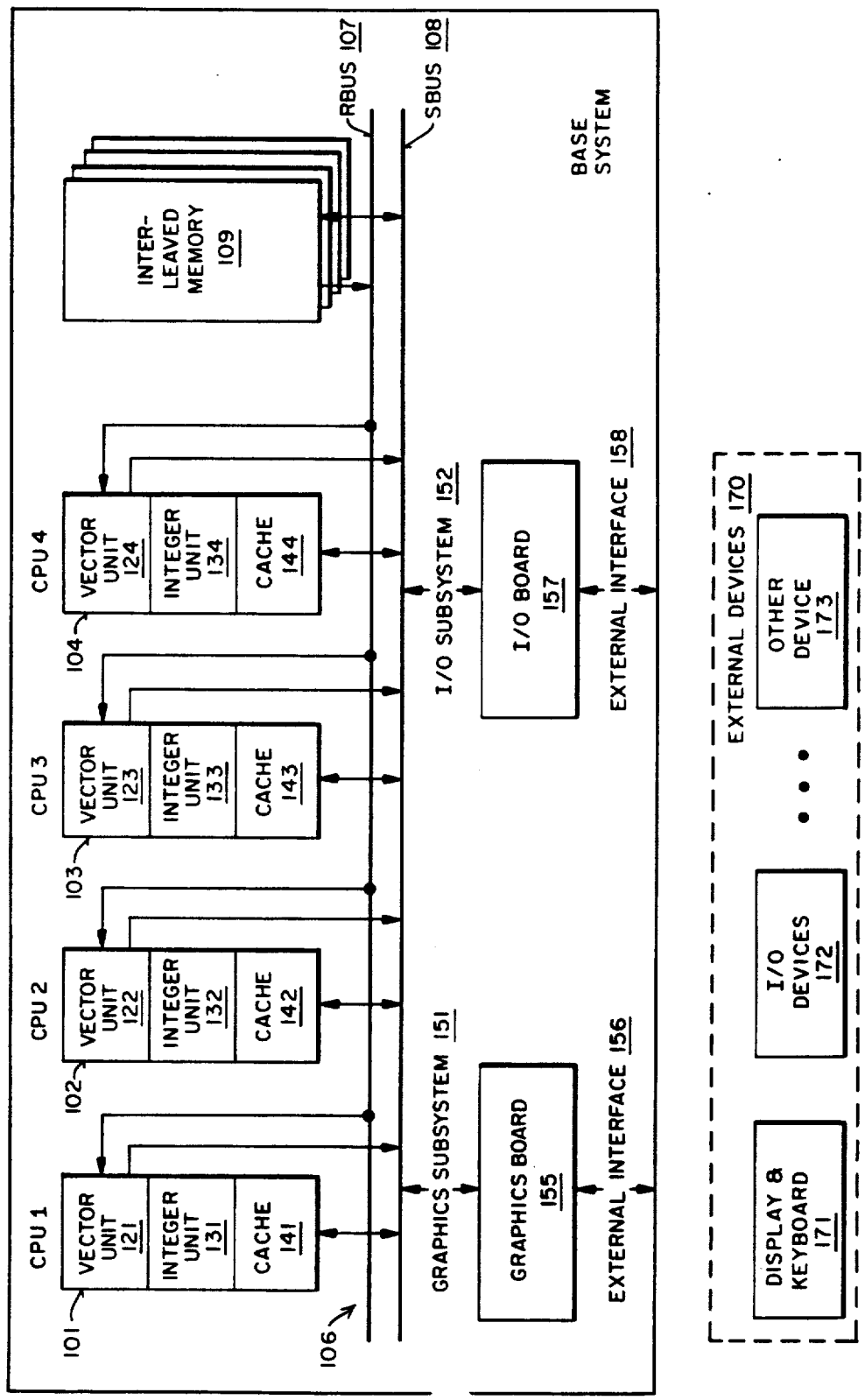
FIG. 1 is a block diagram illustrating an overall block diagram of the computer system of the present invention.

A clock generation circuit for a computer system is described. In the following description, numerous specific details are set forth such as specific circuits, etc., in order to provide a thorough understanding of the present invention. It will be obvious, however, to one skilled in the art that the present invention may be practiced without these specific details. In other instances, well-known circuits, structures and techniques have not been shown in detail in order not to unnecessarily obscure the present invention.

OVERVIEW OF THE COMPUTER SYSTEM OF THE PRESENT INVENTION

Referring first to FIG. 1, an overview of the computer system of the present invention is shown in block diagram form. It will be understood that while FIG. 1 is useful for providing an overall description of the computer system of the present invention, a number of details of the system are not shown. As necessary for disclosure of the present invention, further detail is set forth with reference to the other figures provided with this specification. Further, the present invention is described with reference to its preferred embodiment; alternative embodiments which may be conceived by one of ordinary skill in the art are considered within the scope of the claims set forth below.

The computer system of the preferred embodiment may be described as a multiprocessor vector processing system. In one embodiment, up to four central processing units, CPU 1 101, CPU 2 102, CPU 3 103 and CPU 4 104 are all coupled to a common bus 106. The bus comprises two portions labeled as RBUS 107 and SBUS 108. RBUS 107 is utilized in the present invention exclusively for vector read traffic (thus, the name RBUS). SBUS 108 is utilized for all other transactions including vector writes and accesses by integer processors 131-134, the graphics subsystem 151 and the I/O subsystem 152.

Each CPU comprises a vector unit (such as vector units 121, 122, 123 and 124 corresponding to CPU's 1-4, respectively) for performing vector operations; an integer unit (such as integer units 131, 132, 133 and 134 corresponding to CPU's 1-4, respectively); and cache memory (such as cache memory 141, 142, 143 and 144, respectively).

The system further comprises interleaved memory 109 coupled with the bus 106. The interleaved memory 109 is coupled to both the RBUS 107 for providing vector data from the memory 109 and the SBUS 108 for all other memory accesses. Access to memory 109 is shared by the CPU's 1-4, the graphics subsystem 151 and the I/O subsystem 152.

The graphics subsystem 151 includes a graphics board 155 for interface to an external device through external interface 156. In the preferred embodiment at least one additional expansion graphics board may be provided (not shown). As stated above, the graphics board may interface with one or more external devices 170.

The I/O subsystem 152 includes I/O board 157 which provides, for example, SCSI channels, keyboard interface, networking interface, RS-232 interface, audio interface, cursor control interface, etc. The I/O board 157 is coupled through external interface 158 to one or more of external devices 170.

External devices 170 includes such devices as a display and keyboard 171, I/O devices 172 (tape drives, disk drives, etc.) and other devices 173 (printers, cursor control devices, etc.).

DESCRIPTION OF CLOCK SIGNAL DISTRIBUTION IN THE PREFERRED EMBODIMENT

Referring now to FIG. 2, a clock signal generator 201 is provided on an I/O board coupled with a backplane 202 of the computer system of the present invention. The clock signal generated by the clock generator 201 is distributed over the backplane 202 to each of a plurality of plug-in modules (only processor modules 101, 102, 103 and 104 are shown. The clock signal generator preferably provides a clock at a frequency of 32 Mhz, however, as will be understood by one of ordinary skill in the art other frequencies may be utilized without departure from the present invention. What is important is that the clock frequency of the processors on modules 101-104 are is a multiple of the frequency of the signal generated by clock generator 201. As will be seen, in the preferred embodiment, the clock rate of the integer units 131-134 is 64 Mhz (2 times the system clock rate of 32 Mhz).

It is worthwhile mentioning the clock generator 201 is labeled 2X CLOCK in FIG. 2. In the system of the preferred embodiment, a number of circuits require a clock rate of 16 Mhz. Therefore, in this description of the preferred embodiment, a 1X clock will refer to a clock rate of 16 Mhz, a 2X clock refers to a clock rate of 32 Mhz, and a 4X clock refers to a 64 Mhz clock rate. It is of course understood that alternative embodiments may utilize other clock rates and other multiples. For example, a system may require an 8 Mhz clock which may be termed a 1X clock, a 16 Mhz clock which may be termed a 2X clock, a 32 Mhz clock which may be termed a 4X clock and a 64 Mhz clock which may then be termed an 8X clock.

Each of the processor modules 101-104 comprise a DIVIDE BY 2 circuit 211-214 which is coupled with line 203 (which carries the 32 Mhz system clock signal) of the backplane. The DIVIDE BY 2 circuits 211-214 act to divide the 32 Mhz clocking frequency by two, thus providing a clock at a frequency of 16 Mhz on the plug-in boards 211-214. Frequency division circuits such as DIVIDE BY 2 circuits 211-214 are well known in the applicable art.

The clock signal is coupled through DIVIDE BY 2 circuits 211-214 to integer processing units 131-134. The circuitry of integer processing units 131-134 is described in greater detail with reference to FIG. 3. (It should be noted that integer processing units 131-134 are also referred to as scalar processors 131-134 herein.) While the integer units 131-134 may utilize the 16 Mhz clock provided from DIVIDE BY 2 circuits 211-214 in the manner which will be described below, it should be noted that other circuitry on processor boards 101-104 may utilize the 16 Mhz clock signal without any modification in the clock frequency. Further, in alternative designs certain circuitry on processor boards 101-104 may be provided with the 32 Mhz clock while other circuitry is provided with the 16 Mhz clock.

DESCRIPTION OF THE INTEGER PROCESSOR MODULE OF THE PREFERRED EMBODIMENT

FIG. 3 illustrates an integer processor module 302 of the present invention in greater detail. While FIG. 3 illustrates only a single integer processor, it is pointed out that the circuitry of this processor is duplicated on each processor module 101-104 in the system. (The integer processor 302 corresponds with integer units 101-104 of FIG. 2.)

The integer unit 302 receives a 1X clock signal on line 301. Line 301 is coupled to provide the 1X clock to clock generator 310. Clock generator 310 provides 4 phase offset 4X clock outputs on lines 322 to processor 311. Clock generator 310 is further coupled to receive a 2X clock input from processor 311 on line 321 for phase detection. The circuitry of clock generator 310 will be described in greater detail with reference to FIG. 5. However, in summary it may be said that clock generator 310 functions to receive a clock signal of a first frequency N and to provide phase adjusted clock signals as output of at a frequency of some multiple X of N.

Specifically, X is greater than 1 and, in the preferred embodiment, N is 16 Mhz and X is equal to 4.

Processor 311 is preferably a RISC processor developed by MIPS Computer Systems, Inc. of Sunnyvale, Calif. running at a clock rate of 64 Mhz and available under the tradename R3000. As was stated earlier, prior versions of the computer system of the preferred embodiment utilize other versions of the MIPS microprocessor which run at slower clock rates, i.e., 32 Mhz. In order to maintain board level compatibility with such prior versions of the TITAN computer system, the circuitry described herein was developed.

In the preferred embodiment, the integer unit 302, of course, comprises other circuitry 312. Further detail on the additional circuitry 312 is not essential to an understanding of the present invention and, therefore, such detail will not be described here.

DETAILED DESCRIPTION OF THE CLOCK GENERATION CIRCUITRY OF THE PREFERRED EMBODIMENT

Phase Shifting in the Prior Art Titan Computer

Prior to describing the clock generation circuitry of the preferred embodiment in detail, it may be useful to provide description of clock generation circuitry used in the prior art TITAN computer. This is done with reference to FIG. 4. As stated above, the prior art TITAN computer includes a processor which operates at a clock speed of 32 Mhz. Therefore, the system clock provided by 2X clock generator 201 of FIG. 2 is provided at the correct frequency for operation of the processor in this prior art TITAN computer. However, clock generation circuitry 400 is provided in the prior art TITAN computer to allow for proper phase shifting of clock signals provided to processor 412.

In the prior art TITAN computer system, a 2X clock signal (32 Mhz) is received by clock generator 400 on line 401. As can be appreciated, this 2X clock signal is provided from the backplane 202 on line 203 (shown in FIG. 2) and is not divided by a DIVIDE BY 2 circuit, such as circuits 211-214. The 2X clock signal is provided to programmable delay generator 402. Programmable delay generator 402 provides for up to a one-half clock cycle delay in the clocking signal on line 401 and is controlled by programmable inputs 407. The resulting signal is provided to phase shifter 404.

Simultaneously, the clock signal on line 401 is provided to phase detector 406. Phase detector 406 is further coupled to receive a 1X clock signal on line 414 from processor 412. The phase detector 406 determines whether the clock signal on line 401 is in phase or out of phase with the clocking signal of processor 412. Phase detector 406 is coupled to provide information to phase shifter 404 regarding the number of degrees out of phase the clock signal on line 401 is from the clock signal on 414. Phase shifter 404 then phase shifts the clock signal from line 401 to bring it into phase with the clock signal from the processor.

The output of phase shifter 404 is coupled to delay clock generator 405 which provides 4 phase offset 2X clock signals on lines 411 to processor 412.

The microprocessor utilized by the prior art TITAN computer (a MIPS 32 Mhz R2000 microprocessor) is designed to receive the 4 phase offset 2X clock signals on lines 411 and to provide a 1X clock signal on line 414 from DIVIDE BY 2 output circuit 413.

Clock Generation in the Preferred Embodiment

The clock generation circuitry of the preferred embodiment is illustrated with reference to FIG. 5. In the preferred embodiment, a 1X clock signal is provided on line 501 of clock generator 500 to programmable delay line 502. Programmable delay line 502 is adjustable in two nanosecond steps to provide a delay in the signal received on line 501 of up to one-half of a clock cycle by adjusting the inputs on programmable inputs 507. Programmable inputs 507 are preferably implemented as dip switches or jumpers located on the PC board embodying the circuitry of the processor modules of the present invention, such as processor modules 101-104. The programmable delay line 502 utilized by the preferred embodiment is available commercially from Engineering Components Company of San Luis Obispo, Calif. The programmable delay line 502 is utilized by the system of the preferred embodiment because the preferred processor 512 may require some unspecified propagation delay in the clock signal provided to it. Therefore, programmable delay line 502 is provided to allow for providing this delay after a particular microprocessor unit is selected for the processor board. The delay is adjusted after the microprocessor is installed by adjusting the dip switches or jumpers on the processor board as discussed above.

The delayed signal is provided to frequency multiplier 503 which acts to multiply the frequency of the input clock signal by a multiple, e.g. four. In the preferred embodiment, the frequency multiplier 503 multiplies the 16 Mhz clock frequency by four providing a 64 Mhz clock signal at the output. The frequency multiplier 503 utilized by the preferred embodiment is available from Engineering Components Company of San Luis Obispo, Calif.

The output of frequency multiplier 503 is coupled to phase shifter 504 which provides for synchronization of the input clock with the clocking of the microprocessor. Such synchronization is required in order to provide for a synchronized clock signal at system start-up or other initialization time. Phase shifter 504 is further coupled to receive information from phase detector 506 detailing how many degrees out of phase the clock signal on line 501 is from the clocking signals of processor 512. More specifically, phase detector 506 is coupled to receive the 1X clock signal from line 501 and a 2X clock signal provided from processor 512 on line 514. The 2X clock signal on line 514 is generated by the processor 512 through a DIVIDE BY 2 output circuit which divides the 4X clock signal utilized by the processor 512 by 2. The DIVIDE BY 2 output is a standard output provided by the MIPS R3000 microprocessor utilized by the preferred embodiment of the present invention. The timing and synchronization of the 2X signal on line 514 and the 1X signal on line 501 will be better understood with reference to FIGS. 6 and 7 and with reference to the description of these figures set forth below.

The phase shifter 504 utilized by the preferred embodiment comprised of standard off-the-shelf TTL products, the construction of which will be obvious to one of ordinary skill in the art.

The phase shifter 504 is coupled to provide the synchronized 4X clock signal to delay line clock generator 505. The processor 512 of the preferred embodiment requires 4 phase-shifted clock signals as inputs and it is the function of the delay line clock generator 505 to provide these 4 phase shifted clocks to the processor 512. The delay line clock generator 505 provides the 4 phase shifted 4X clocks on lines 511; the timing of these signals will be described in greater detail with reference to FIG. 8.

As stated above, processor 512 of the preferred embodiment is available as from MIPS Computer Systems, Inc. of Sunnyvale, Calif. and operates at 64 Mhz.

Thus, what has been described is a circuit which provides a clock signal (or plurality of clock signals) at a multiple of the system clock frequency allowing for design of a computer system having processor synchronized with a system clock and allowing the processors to run at a clock speed which is some multiple of the system clock speed. Thus, a multiple processor computer system may have some of its processors upgraded to higher speed processors while retaining some of the original, lower speed, processors in the system and the higher speed processors are run in lock step with system clock and, thus, in lock step with the lower speed processors.

The described circuit is not only useful where it is desired to operate a multiprocessor computer system having certain processor running at a first speed and certain other processors running at a second speed while retaining synchronization between the processors. It is also useful where, as in the case of the preferred embodiment, the system clock is provided on a backplane or the like and circuitry provided on an add-on board (such as a processor board) requires a higher speed clock signal than the existing system clock. The circuit of the present invention provides such a higher speed clock without requiring replacement of the clock signal generator on the backplane.

DESCRIPTION OF CLOCKING SIGNALS OF THE PREFERRED EMBODIMENT

It is useful to an understanding of the present invention to described certain clocking signals in greater detail. FIG. 6 illustrates a timing diagram showing the 1X clock signal 601 as it may appear on line 501 and the 2X clock signal 602 as it may appear on line 514 when the computer system of the preferred embodiment is initially powered-up. As illustrated by FIG. 6, the 1X clock 601 (which is in synchronization with the system clock) may be initially out of phase with the 2X clock 602 provided from DIVIDE BY 2 output 513 of the processor 512. (In the illustration of FIG. 6, 1X clock 601 is shown as being 180° out of phase with the 2X clock signal 602.) Therefore, as discussed above, both the 1X clock 601 and the 2X clock 602 are provided as inputs to phase detector 506 which detects whether these clock signals are out of phase. If an out of phase condition is detected, the phase shifter 504 is controlled by the phase detector 506 to shift the phase of the input clock signal 601. FIG. 7 illustrates clock signals 601 and 602 in phase after being affected by phase shifter 504.

Of course, initialization of the system may find signals 601 and 602 in phase; in such a case, the phase of signal 601 is not shifted.

FIG. 8 is provided to illustrate the timing of the four phase shifted clock signal labeled as clock 01 801, clock 02 802, clock 03 803 and clock 04 804 provided on lines 511 to processor 512 as well as the 1X clock 800. The output signal from DIVIDE BY 2 output 513 is shown as CLOCK OUT 805 and is delayed some unspecified, but fixed, time interval from clock 01 signal 801 as indicated by the unspecified delay 806. The programmable delay line 502 is provided to allow synchronization of CLOCK OUT signal 805 with the 1X clock signal 800. The programmable inputs 507 are adjusted to provide delays in the generation of clock 01 signal 801 until CLOCK OUT 805 is synchronized with the 1X clock signal 800.

It should be noted that the specifications of the MIPS R3000 microprocessor provide CLOCK OUT 805 is delayed by an unspecified interval from the clock 01 signal 801. Although the delay is unspecified, the delay is fixed for any particular R3000 microprocessor unit. Therefore, during manufacturing, assembly and test of the processor boards of the preferred embodiment, the dip switches or jumpers (programmable inputs 507) controlling the programmable delay line 507 are adjusted to provide for appropriate delay for the particular R3000 microprocessor unit utilized.

Thus, a clock generation circuit has been described. What is claimed is:

1. A computer system comprising:
   (a) system clock generation means for generating a first clock signal of frequency X;
   (b) processor means for processing information, said processor means requiring a second clocking signal of a frequency N time X;
   (c) frequency multiplier means for multiplying said first clock signal by an integer N and providing said processor means with said second clocking signal;
   (d) a first line coupling said system clock generation means with said frequency multiplier means;
   (e) a second line coupling said frequency multiplier means with said processor means; and
   (f) frequency division means, coupled to said system clock generation means, dividing said first clock signal by a factor M and for providing a third clock signal of frequency X/M, said frequency division means coupled to provide said third clock signal to said frequency multiplier means.

2. The computer system as recited by claim 1 wherein X is equal to 32 Mhz.

3. The computer system as recited by claim 1 wherein N is equal to 4.

4. The computer system as recited by claim 3 wherein M is equal to 2.

5. A multiple processor computer system comprising:
   (a) a clock signal generator coupled with a backplane, said clock signal generator for generating a first clock signal of frequency X;
   (b) means for distributing said first clock signal along said backplane;
   (c) a first processor module having a first processor operating at a frequency F1, said first processor module coupled to said backplane to receive said first clock signal; and
   (d) a second processor module coupled to said backplane to receive said first clock signal, said second processor module comprising:
      (1) a second processor operating at a frequency F2;
      (2) frequency multiplication means for multiplying said first clock signal frequency by a multiple N, said frequency multiplication means further coupled to provide a second clock signal of frequency F2 to said second processor.

6. The computer system as recited by claim 5 wherein X is 32 Mhz.

7. The computer system as recited by claim 6 wherein N is 4.

8. The computer system as recited by claim 7 wherein F2 is 128 Mhz.

9. The computer system as recited by claim 8 wherein F1 is 32 Mhz.

10. The computer system as recited by claim 8 wherein said second processor is a MIPS R3000 processor.

11. The computer system as recited by claim 5 wherein said second processor module further comprising frequency division means coupled to receive said first clock signal for dividing said first clock signal by a factor M, said frequency division means coupled to provide a third clock signal of frequency X/M to said frequency multiplication means.

12. A computer system comprising:
   (a) system clock generation means for generating a first clock signal of a frequency X;
   (b) processor means for processing information, said processor means requiring a second clock signal of a frequency N times X, said processor means coupled to a phase shifting means to receive a phase adjusted clock signal; said processor means further providing a third clock signal as an output, said processor means requiring said second clock signal to be in phase with said third clock signal;
   (c) phase detection means, coupled to said system clock generation means and said processor means, for detecting the relative phase of said first clock signal and said third clock signal:
   (d) multiplication means coupled to said system clock generation means, said multiplication means for multiplying the frequency of said first clock signal by a factor N and for providing as an output said second clock signal, said second clock signal having a frequency N times X;
   (e) said phase shifting means coupled with said multiplication means to receive said second clock signal and coupled with said phase detection means to receive an indication of the relative phase of said first signal and said third signal, said phase shifting means providing as an output said phase adjusted clock signal.

13. A computer system comprising:
   (a) system clock generation means for generating a first clock signal of a frequency X;
   (b) processor means for processing information, said processor means requiring a second synchronized clock signal of a frequency N times X, and receiving said second synchronized clock signal from a synchronization means, said processor means further providing a third clock signal as an output, said processor means requiring said second synchronized clock signal to be synchronized with said third clock signal;
   (c) said synchronization means for synchronizing said first clock signal and said third clock signal and creating said second synchronized signal, said synchronization means coupled to receive said first clock signal from said system clock generation means, a fourth multiplied clock signal from a multiplication means and said third clock signal from said processor means; and
   (d) multiplication means coupled to said system clock generation means, said multiplication means for multiplying the frequency of said first clock signal by a factor N and for providing as an output said fourth multiplied clock signal, said fourth multiplied clock signal having a frequency N times X.

* * * * *

Disclaimer and Dedication

5,077,686—Jon Rubinstein, Palo Alto, Calif. CLOCK GENERATOR FOR A COMPUTER SYSTEM. Patent dated Dec. 31, 1991. Disclaimer filed Dec. 23, 1996, by the assignee, The Kubota Graphics Liquidating Trust.

Hereby disclaims and dedicates to the Public claims 1-13 of said patent.
*(Official Gazette,* June 17, 1997)